US008596216B2

(12) United States Patent
Kadowaki et al.

(10) Patent No.: US 8,596,216 B2
(45) Date of Patent: Dec. 3, 2013

(54) METHOD FOR THE PRODUCTION OF WATER-REACTIVE AL FILM AND CONSTITUENT MEMBER FOR FILM-FORMING CHAMBER

(75) Inventors: Yutaka Kadowaki, Kanagawa (JP); Tomoko Saitou, Kanagawa (JP); Keng Weng Lim, Kanagawa (JP); Katsuhiko Mushiake, Chiba (JP)

(73) Assignee: ULVAC, Inc., Kanagawa (JP)

( * ) Notice: Subject to any disclaimer, the term of this patent is extended or adjusted under 35 U.S.C. 154(b) by 465 days.

(21) Appl. No.: 12/990,152

(22) PCT Filed: Apr. 27, 2009

(86) PCT No.: PCT/JP2009/058260
§ 371 (c)(1),
(2), (4) Date: Oct. 28, 2010

(87) PCT Pub. No.: WO2009/133841
PCT Pub. Date: Nov. 5, 2009

(65) Prior Publication Data
US 2011/0041762 A1 Feb. 24, 2011

(30) Foreign Application Priority Data
Apr. 30, 2008 (JP) ................. 2008-118856

(51) Int. Cl.
C22C 21/00 (2006.01)
B05C 11/00 (2006.01)
C23C 4/08 (2006.01)

(52) U.S. Cl.
USPC ............................ 118/504; 420/548; 427/456

(58) Field of Classification Search
None
See application file for complete search history.

(56) References Cited

U.S. PATENT DOCUMENTS 3,974,055 A  8/1976  Redding et al.
4,412,972 A * 11/1983 Mori ............................ 420/530
6,132,805 A * 10/2000 Moslehi ....................... 427/248.1

FOREIGN PATENT DOCUMENTS

| JP | 62-290888 A | 12/1987 |
| JP | 10-030896 A | 2/1998 |
| JP | 2005-256063 A | 9/2005 |

(Continued)

OTHER PUBLICATIONS

Halford et al, effects of vacuum deposition conditions on ellipsometric parameters, optical constants and reflectance of ultrapure aluminum films, 1973, journal of the optical society of america, pp. 786-792.*

(Continued)

*Primary Examiner* — Melvin C Mayes
*Assistant Examiner* — Stefanie Cohen
(74) *Attorney, Agent, or Firm* — Arent Fox LLP

(57) ABSTRACT

Provided herein are a method for the production of a water-reactive Al film which comprises the steps of melting a material which comprises 4NAl or 5NAl as an Al raw material and added In in an amount ranging from 2 to 5% by mass on the basis of the mass of the Al raw material in such a manner that the composition of the material becomes uniform; thermally spraying the resulting molten material on the surface of a base material according to the electric arc spraying technique, while using Ar gas as a spraying gas; and solidifying the sprayed molten material through quenching to thus form an Al film in which In is uniformly dispersed in Al crystalline grains; and a constituent member for a film-forming chamber, which is provided, on the surface, with this water-reactive Al film.

6 Claims, 3 Drawing Sheets

(56) References Cited

FOREIGN PATENT DOCUMENTS

| | | |
|---|---|---|
| JP | 2006-002223 A | 1/2006 |
| WO | WO 9110760 A2 * | 7/1991 |
| WO | WO 2006/003772 A1 | 1/2006 |

OTHER PUBLICATIONS

Russian Office Action 2010148780/(070438) dated Nov. 29, 2010.
Polyak M.S., "Mashinostroenie", Hardening Technology, L.V.M.—Skrypt, 1995.

* cited by examiner

METHOD FOR THE PRODUCTION OF WATER-REACTIVE AL FILM AND CONSTITUENT MEMBER FOR FILM-FORMING CHAMBER

CROSS-REFERENCED TO RELATED APPLICATION

This application is a National Stage entry of International Application No. PCT/JP2009/058260, filed Apr. 27, 2009, which claims priority to Japanese Patent Application 2008-118856, filed Apr. 30, 2008. The disclosure of the prior application is hereby incorporated in its entirety by reference.

TECHNICAL FIELD

The present invention relates to a method for the production of a water-reactive Al film and a constituent member for a film-forming chamber and in particular to a method for the production of a water-reactive Al film according to the electric arc spraying technique and a constituent member for a film-forming chamber, which is covered with this Al film.

BACKGROUND ART

In a film-forming apparatus for forming a thin film according to, for instance, the sputtering technique, the vacuum deposition technique, the ion-plating technique, or the CVD technique, a film of a metal or a metal compound, as a film-forming material, is inevitably adhered to a constituent member for a film-forming chamber, which is positioned within the film-forming apparatus during the film-forming process. As such constituent members for a film-forming chamber, there can be listed, for instance, an adhesion-preventive plate for inhibiting the adhesion of any film on the inner portions of a vacuum chamber other than a substrate, a shutter, a mask used for forming such a film only on the desired area on the substrate and a tray for conveying the substrate. A film having the same composition as that of the intended thin film (a thin film to be formed on a substrate) is also deposited on or adhered to these members during the film-forming process. In this respect, it is the usual practice that these members are repeatedly used after the removal of the film adhered thereto.

The film inevitably adhered to these constituent members for a film-forming chamber is thickened in proportion to the length of the working time of the film-forming process. Such an adhered film is peeled off, in the form of particles, from the constituent members for a film-forming chamber due to the action of the internal stress of the adhered film or the stress accumulated in the film through the repeated thermal hysteresis, and adhered to the substrate and this would accordingly result in the formation of a film having various defects. For this reason, it is the common practice that the constituent members for a film-forming chamber are subjected to the following cycle, at regular intervals; the removal or dismantlement thereof from the film-forming apparatus at a stage in which the adhered film is not yet peeled off, the washing thereof to remove the film adhered thereto, the subjection thereof to a surface-finishing treatment and the subsequent reuse thereof.

When using a valuable metal such as Al, Mo, Co, W, Pd, Nd, In, Ti, Re, Ta, Au, Pt, Se and Al, as a film-forming material, there has been desired for the establishment of a processing technique for the recovery of metals which do not take part in the formation of the film thereof on the surface of a substrate and are adhered to the constituent members other than the substrate and for the development of a technique for making the members reusable.

For instance, in the case of the adhesion-preventive plate used for inhibiting the adhesion of any film-forming material onto, for instance, the inner wall of the film-forming apparatus and the surface of a variety of such constituent members for a film-forming chamber, other than the surface of a substrate, the deposit formed during the film-forming process is, in the existing circumstances, peeled off from the foregoing members and/or the inner wall, for the reuse thereof. Currently used as such a method for the peeling off of this deposit include, for instance, the sandblasting technique, the wet etching technique which makes use of an acid or an alkali and the peeling technique which uses the hydrogen embrittlement by the action of, for instance, hydrogen peroxide and even the peeling method which makes use of the electrolysis thereof. In this case, when implementing the treatment for peeling off of the deposit, the adhesion-preventive plate is damaged in a treating liquid in no small quantities and therefore, the adhesion-preventive plate would be limited in the number of reusable times. For this reason, there has been desired for the development of a film-peeling technique which can reduce the occurrence of any damage of the adhesion-preventive plate as low as possible.

In this respect, however, if the concentration of the peeled deposit present in the blasting waste generated during the foregoing sandblasting technique and in the waste liquor generated in the treatment with an agent such as an acid treatment or an alkali treatment is low, the cost required for the recovery of the valuable metals is correspondingly quite high and accordingly, this method is not profitable. In such case, the deposit thus peeled off is accordingly handled as waste, under the present conditions.

In the foregoing treatment with an agent, not only the cost for the agent per se is high, but also the cost required for the post-treatment of the used liquid containing such an agent is high and further the occurrence of any environmental pollution should be prevented. For this reason, there has been desired for the reduction of the amount of the foregoing agent to be used as low as possible. In addition, when carrying out the foregoing treatment with an agent, the film-forming material peeled off from the adhesion-preventive plate would be converted into other new chemical substances and therefore, the cost required for the recovery of only the film-forming material from the peeled deposit would further be piled up. Accordingly, the materials to be recovered are only the film-forming materials whose unit price is balanced with the recovery cost, in the existing circumstances.

In addition to the method for peeling off of the deposit, as has been discussed above, there has been known a technique for recovering valuable metals which comprises the steps of implementing a film-forming process in an apparatus provided with constituent members covered with an Al film consisting of a water-reactive Al composite material having such characteristic properties that it can undergo a reaction in a moisture-containing atmosphere and can thus be converted into substances soluble or active in water; peeling off and separating the film adhered to the Al film, during the film-forming process, through the reaction and/or dissolution of the Al film; and then recovering the valuable metals included in the film-forming material present in the adhered film thus peeled off (see, for instance, Patent Document 1 specified below). In this water-reactive Al composite material, the surface of a small or fine lump composed of Al crystalline grains is covered with a film of In and/or Si.

PRIOR ART LITERATURE

Patent Document

Patent Document 1: JP-A-2005-256063 (Claims).

DISCLOSURE OF THE INVENTION

Problems that the Invention is to Solve

Accordingly, it is an object, in a broad sense, of the present invention to solve the foregoing problems associated with the conventional techniques and more specifically to provide a method for the production of an Al film, which can be made soluble through the reaction with water in a moisture-containing atmosphere; and a constituent member for a film-forming chamber, which is covered with this Al film.

Means for the Solution of the Problems

The method for the production of a water-reactive al film according to the present invention comprises the steps of melting a material which comprises 4NAl or 5NAl as an Al raw material and added In in an amount ranging from 2 to 5% by mass on the basis of the mass of the Al raw material in such a manner that the composition of the material becomes uniform; thermally spraying the resulting molten material on the surface of a base material according to the electric arc spraying technique; and solidifying the sprayed molten material through quenching to thus form an Al film in which In is uniformly dispersed in Al crystalline grains.

In this respect, if the added amount of In is less than 2% by mass, the resulting Al film is impaired in its reactivity with water, while if it exceeds 5% by mass, the reactivity of the film with water becomes extremely high and the Al film sometimes causes a reaction with moisture within the atmosphere.

The thermally sprayed Al film thus produced is a film in which In crystalline grains exist in Al crystalline grains in their highly uniformly dispersed conditions and the Al film can easily undergo a reaction with water within a moisture-containing atmosphere and can be dissolved in water while generating hydrogen gas.

Alternatively, the method for the production of a water-reactive Al film according to the present invention is characterized in that it comprises the steps of melting a material which comprises 4NAl or 5NAl as an Al raw material, and added In in an amount ranging from 2 to 5% by mass and added Si, including the Si as an impurity of the Al raw material in a total amount ranging from 0.04 to 0.6% by mass and preferably 0.04 to 0.2% by mass, on the basis of the mass of the Al raw material in such a manner that the resulting molten material has a uniform composition; thermally spraying the resulting molten material on the surface of a base material according to the electric arc spraying technique; and solidifying the sprayed molten material through quenching to thus form an Al film in which In is uniformly dispersed in Al crystalline grains.

In this connection, if the amount of In is less than 2% by mass or if it exceeds 5% by mass, the problems described above would arise. On the other hand, if the total amount of Si is less than 0.04% by mass, the effect of controlling the reactivity, with water, of the resulting Al film is impaired, while if the total amount of Si exceeds 0.2% by mass, the reactivity of the resulting Al film with water begins to reduce and if the amount thereof exceeds 0.6% by mass, the reactivity, with water, of the Al film per se is reduced.

The constituent member for a film-forming chamber of a film-forming apparatus according to the present invention is characterized in that the constituent member is provided, on the surface, with the foregoing water-reactive Al film.

The constituent member for a film-forming chamber according to the present invention is further characterized in that the constituent member is an adhesion-preventive plate, a shutter or a mask.

Effects of the Invention

The thermally sprayed Al film produced by the electric arc spraying technique according to the present invention can easily be produced by a simple process while lowering the cost of production. Moreover, the Al film has such characteristic properties that it can be dissolved in water through the reaction with water in a moisture-containing atmosphere, even after the film experiences a thermal hysteresis phenomenon as a result of the film-forming process carried out at a temperature ranging from about 300 to 350° C.

This Al film can undergo a reaction with water in the presence of moisture and can effectively be dissolved in water while generating hydrogen gas. Accordingly, the following effects can be achieved by the Al composite film of the present invention: If the film-forming operation is carried out using a film-forming apparatus provided with constituent members for a film-forming chamber (for instance, an adhesion-preventive plate, a shutter and a mask), which are covered with the water-reactive Al film of the present invention, the inevitably adhered film consisting essentially of the film-forming material and adhered to the surface of, for instance, an adhesion-preventive plate during the film-forming process can be peeled off and/or separated from the surface of the constituent member for a film-forming chamber through the reaction and/or dissolution of this Al film and the valuable metals included in the film-forming material can be easily recovered from the adhered film peeled off from the surface of the constituent members and the constituent members can thus be reused over an increased number of times.

MODE FOR CARRYING OUT THE INVENTION

Figure 1:
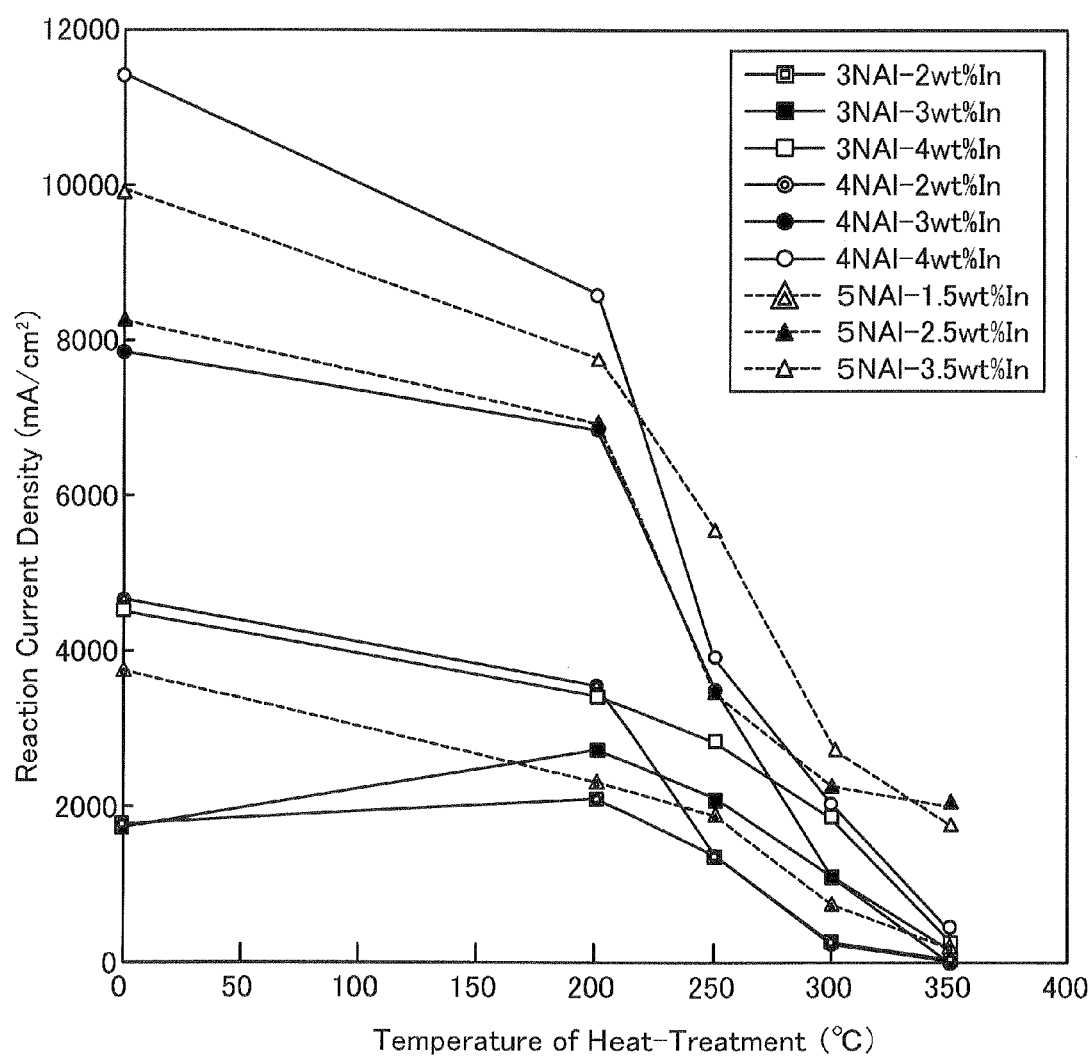
FIG. 1 is a graph showing the relation between the heat-treatment temperature (° C.) and the reaction current density (mA/cm2), which is observed for the Al film prepared in Example 1.

When producing a thin film in a film-forming apparatus according to a variety of film-forming techniques such as the sputtering technique, the interior of the film-forming chamber is subjected to the influence of repeated thermal hysteresis. For this reason, the surface of the constituent members such as an adhesion-preventive plate, which are positioned within the film-forming chamber and which are coated with the Al film of the present invention, is also subjected to the influence of repeated thermal hysteresis. Accordingly, it would be necessary that the Al film, at the time of the film-formation through the thermal spraying technique before the film is subjected to the influence of the thermal hysteresis, is not only stable, but also easy to handle. At the same time, the Al film provided thereon with adhered film inevitably attached thereto during the film-forming process should have such a solubility (or activity) that the Al film can easily be peeled off from the base material (the constituent members) along with the adhered film and further should be stable, even after the Al film is influenced by the thermal hysteresis experienced in the film-forming process. In the case of the water-reactive Al film according to the present invention, such requirement for the solubility or activity would sufficiently be satisfied.

The upper limit of the thermal hysteresis temperature within the foregoing film-forming chamber is on the order of about 300 to 350° C. when the film is formed according to, for instance, the sputtering technique, the vacuum deposition technique, the ion-plating technique or the CVD technique. Therefore, it would in general be sufficient, from the practical standpoint, that the Al film has reactivity with water even after it is subjected to the influence of the thermal hysteresis up to a temperature of 300° C. and it would be more suitable that the Al film preferably has reactivity with water even after the Al film experiences the thermal hysteresis up to a temperature of 350° C. In the case of the water-reactive Al film according to the present invention, such requirement for the solubility would certainly be satisfied, as will be explained below more in detail.

The foregoing solubility or activity of the Al composite film of the present invention is evaluated on the basis of the current density (in the present invention, also referred to as "reaction current density ($mA/cm^2$)") as determined by immersing a base material covered with the Al film in warm water maintained at a predetermined temperature (ranging from 40 to 130° C. and preferably 80 to 100° C.) and then determining the current density of the immersion liquid. This determination method is one which comprises the steps of determining the loss in weight observed for each sample before and after the immersion thereof in the treating liquid and then converting the result into the current density value while taking into consideration, for instance, the surface area of the sample and the immersion time of the same in the treating liquid. It can be said that the Al film provided thereon with adhered film inevitably attached thereto during the film-forming process has such a solubility (or activity) that the Al film can easily be peeled off from the base material along with the adhered film even after the Al film is subjected to the influence of thermal hysteresis experienced in the film-forming process, so long as the reaction current density as determined according to this method is not less than 50 $mA/cm^2$.

The present invention will hereunder be described with reference to the following embodiments.

In the thermally sprayed Al film by the method for the production according to the present invention, In is highly uniformly dispersed or distributed within the Al matrix and accordingly, the Al film can easily react with water within a moisture-containing atmosphere such as water, water vapor or an aqueous solution and as a result, it can thus be made soluble or active in water. Usable in the present invention as Al raw materials are, for instance, those having purities of 4N (99.99%) and 5N (99.999%). Each of them can be obtained by further treating an Al raw material having a low purity and prepared by the electrolytic process such as 2N (99%) Al or 3N (99.9%) Al according to the three layer electrolytic process or a method according to the partial solidification technique (the segregation technique) which makes use of the temperature difference between the solid and liquid phases upon the solidification. The principal impurities present in the 4NAl and 5NAl include Fe and Si and these Al raw materials further include, for instance, Cu, Ni and C as impurities other than the foregoing principal ones.

In the Al—In system, the electrochemical potential difference between Al and In is in general quite high, but if the spontaneous oxide film of Al is present on the surface thereof, the ionization of Al is not advanced at all. However, when the spontaneous oxide film is once broken or removed and Al directly comes in close contact with In, the ionization of Al can be promoted very rapidly due to the potential difference between them. At this stage, In is, in the as-is status thereof, highly dispersed throughout the Al crystalline grains without causing any chemical change. In has a low melting point (157° C.) and never forms any solid-solution with Al. Accordingly, a desired Al film can be obtained by melting Al and In in such a manner that the composition thereof becomes uniform while taking care of the density difference between them and then thermally spraying the resulting molten material on the surface of a base material according to the electric arc spraying technique to thus give an Al film, as a result of the solidification of the deposited molten material through quenching as well as the compressive effect of the solidification.

The added In is highly dispersed throughout the Al crystalline grains due to the action of the electric arc spraying process and it is maintained in the state in which it comes in direct contact with Al. The added In never forms a stable phase along with Al and therefore, the Al/In interface is maintained in its high energy state and can undergo a vigorous reaction with water within a moisture-containing atmosphere at the contact surface with water. In addition, In as an added element is in a highly dispersed condition and the $H_2$ gas bubbles generated during the reaction undergo expansion to thus generate a mechanical action. Therefore, the reaction products mainly comprising AlOOH are finely pulverized on the surface, due to the mechanical action, without forming any film thereon and dispersed in the liquid and the reaction or the dissolution reaction continuously and explosively proceeds at the successively renewed reaction boundary.

The higher the purity of an Al raw material, the more conspicuous the behavior of the Al—In system described above and, in other words, the behavior is particularly conspicuous in the case of 4NAl and 5NAl as compared with 2NAl and 3NAl.

According to the present invention, the thermally sprayed Al film is produced by forming a film on the surface of a base material to be treated in a predetermined atmosphere according to the electric arc spraying technique, while making use of a composite material consisting of an Al—In system. More specifically, 4NAl and In are prepared, In is incorporated into this Al raw material in an amount ranging from 2 to 5% by mass on the basis of the mass of the Al raw material to thus uniformly disperse or dissolve In in the Al raw material, the resulting blend is then formed into a rod-like or wire-like article, the article thus formed and serving as a material for thermal spraying is molten and sprayed on the surface of a base material, which is subsequently used as a constituent member for a film-forming chamber of a film-forming apparatus such as an adhesion-preventive plate, according to the electric arc spraying technique, while using Ar gas as a spraying gas, and the sprayed and molten material is solidified through quenching to thus cover the surface and to thereby form a base material provided thereon with a desired water-reactive thermally sprayed Al film. The thermally sprayed film thus prepared is one in which In crystalline grains (having a particle size of not greater than 10 nm) are highly uniformly dispersed in Al crystalline grains.

In this case, the electric arc spraying process should be carried out in the atmosphere or an $N_2$ or Ar gas atmosphere.

The thermally sprayed Al film consisting essentially of the foregoing 4NAl—In composite material, which is formed through the electric arc spraying process, can be handled with great difficulty in the as-is state or in the state immediately after formation thereof, since it certainly shows high activity and the solubility thereof in water within a moisture-containing atmosphere is likewise too high. However, if a desired amount of Si is added to this material, the resulting thermally sprayed Al film is reduced in its activity and the handling of the film becomes easy. Contrary to this, the thermally sprayed Al film after it is subjected to the influence of the thermal hysteresis is improved in its activity and the film can thus show a high ability of dissolution (activity) in an atmosphere in which moisture is present. For this reason, the Al film may sometimes be converted into powder at ordinary temperature in the atmosphere depending on the compositional ratio of In and Si in the film. In such case, the Al film is preferably stored in an atmosphere free of any moisture (a vacuum atmosphere may likewise be used) in order to avoid the occurrence of the reaction thereof with the moisture in the atmosphere.

Now, the present invention will be described with reference to the water-reactive Al film consisting essentially of a 4NAl—In—Si, by way of example. The method for the production of water-reactive Al film by the electric arc spraying technique according to the present invention, as mentioned above, can be applied to the method for the production of the thermally sprayed Al film consisting of 4NAl—In—Si.

The foregoing thermally sprayed Al film is, for instance, produced according to the method detailed below:

More specifically, the method for the preparation of the thermally sprayed Al film comprises the steps of preparing 4NAl, In and Si; combining the Al raw material with In, in an amount ranging from 2 to 5% by mass, and Si (inclusive of the Si present in the 4NAl) in a total amount ranging from 0.04 to 0.6% by mass and preferably 0.04 to 0.2% by mass, while taking into consideration the amount of Si present in the 4NAl as a contaminant to thus uniformly dissolve and disperse the both In and Si into Al; forming the resulting uniform mixture into a form of a rod or a wire to thus give a material for electric arc spray; then covering the surface of a base material, for instance, a constituent member for a film-forming chamber of a film-forming apparatus such as an adhesion-preventive plate used in the chamber by spraying the material in its molten state on the surface of the base material according to the electric arc spraying technique, while using Ar gas as a spraying gas; and subsequently quenching and solidifying the sprayed material to thus give a base material provided thereon with a desired water-reactive thermally sprayed Al film. The thermally sprayed film thus formed is one in which In is present in Al crystalline grains in its highly, uniformly dispersed state, as has been described above.

As has been described above, in the case of the thermally sprayed Al film produced using a composite material obtained by adding a predetermined amount of Si to an Al—In system, the activity, i.e. the solubility, in water, of the thermally sprayed Al film can be controlled without subjecting the Al film to any post-treatment and this accordingly prevents the thermally sprayed film from the dissolution through the reaction with the moisture present in the atmosphere and this also makes the handling of the film easier. Moreover, if the upper limit of the temperature during the thermal hysteresis phenomenon taking place within the film-forming chamber is on the order of about 300° C., a thermally sprayed Al film showing practically acceptable activity or solubility in water can be produced using an Al composite material which comprises Si, incorporated therein, in an amount ranging from 0.04 to 0.6% by mass and preferably 0.05 to 0.5% by mass, while if the upper limit of the temperature during the thermal hysteresis phenomenon is high on the order of about 350° C., a thermally sprayed Al film showing practically acceptable activity or solubility in water can be produced using an Al composite material which comprises Si, incorporated therein, in an amount ranging from 0.04 to 0.2% by mass and preferably 0.05 to 0.1% by mass.

When immersing the base material covered with the thermally sprayed Al film in warm water or spraying water vapor on the base material, as has been discussed above, for instance, when immersing the same in warm water whose temperature is set at a predetermined level, the reaction of the film with water is initiated immediately after the immersion, which is accompanied by the generation of hydrogen gas, the water is blackened as the reaction further proceeds because of the presence of, for instance, deposited In, finally the thermally sprayed film is completely dissolved and precipitates consisting of, for instance, Al and In remain in the warm water. This reaction vigorously proceeds with the increase in the temperature of the water.

If using a base material, whose surface is covered with the foregoing water-reactive Al film, as a constituent member for a film-forming chamber such as an adhesion-preventive plate or a shutter which is positioned within the film-forming chamber of a film-forming apparatus, as has been discussed above, the film composed of the film-forming material inevitably adhered to the constituent member for a film-forming chamber can easily be peeled off from the constituent member after the completion of the film-forming process carried out over a predetermined number of times or cycles and accordingly, the valuable metals can be recovered from the peeled Al film provided thereon with the deposited film of the film-forming material, with ease.

In this case, used as a liquid for peeling off of the Al composite film is not any chemical reagent, but is water such as pure water, water vapor or an aqueous solution. Accordingly, it is possible to prevent the occurrence of any damage of the constituent member for a film-forming chamber such as an adhesion-preventive plate due to the dissolution of the latter in the liquid and these constituent members can be reused over a substantially increased number of times, as compared with that observed for the case in which a chemical reagent is used as such a liquid for peeling. Moreover, any chemical reagent is not used in the present invention and therefore, this would result in the considerable reduction of the cost required for the post-treatment and in the preservation of the environment. Furthermore, most of the film-forming materials adhered to the constituent members for a film-forming chamber such as an adhesion-preventive plate is never dissolved in water and accordingly, the present invention has such an advantage that a material can be recovered in the form of a solid having a composition and a shape substantially identical to those observed for the film-forming material. In addition, the present invention shows such an advantage that not only the recovery cost can be dramatically reduced, but also the process to be used for the recovery can be simplified and accordingly, wide variety of materials can be recovered according to the present invention. For instance, if the film-forming materials are expensive metals such as precious metals and rare metals, the use of a constituent member for a film-forming chamber such as an adhesion-preventive plate, which is provided, on the surface thereof, with a thermally sprayed film consisting of the water-reactive Al composite material of the present invention, would permit the removal or peeling off of the film inevitably adhered to the constituent member during the film-forming operations and consisting of the film-forming material, simply by immersing the member in water or spraying water vapor on the same. This in turn permits the recovery of precious metals and rare metals without being accompanied by any contamination. Thus, the recovery cost can be reduced and the film-forming material can likewise be recovered while they are still in their high quality conditions.

The present invention will now be described in more detail below with reference to the following Examples.

Example 1

The following Al—In compositions were prepared and then inspected for the relation between the Al purity, the In concentrations and the solubility or activity of the resulting thermally sprayed films and the results thus obtained were investigated and compared with one another, while using 3NAl, 4NAl and 5NAl as the Al raw materials. In this connection, the added amount of In is expressed in terms of that relative to the mass (weight) of the Al raw material used.

3NAl—2% by mass (wt %) of In;
3NAl—3% by mass of In;
3NAl—4% by mass of In;
4NAl—2% by mass of In;
4NAl—3% by mass of In;
4NAl—4% by mass of In;
5NAl—1.5% by mass of In;
5NAl—2.5% by mass of In;
5NAl—3.5% by mass of In;

There was combined Al with In in a rate specified above to make In uniformly disperse or dissolve in Al, the resulting blend was formed into a rod-like article for use as a thermal spraying material, and then the thermal spraying material was molten and thermally sprayed on the surface of a base material made of aluminum according to the rod electric art spraying technique (heat source: electric energy; temperature: about 6,000° C.), while using Ar gas as a spraying gas (spraying gas pressure: about 50 psi) to thus give a thermally sprayed film. Each of the thermally sprayed films thus produced was subjected to a heat-treatment at a temperature ranging from 0 to 350° C. (the film was treated in the atmosphere for one hour and subsequently cooled within a furnace) in place of subjecting the same to the influence of thermal hysteresis possibly encountered during the film-forming process. Thereafter, the base material provided thereon with the thermally sprayed film prior to the heat-treatment (0° C.) and the same base material used above and obtained after the heat-treatment each were immersed in 300 mL of pure water maintained at 80° C., followed by the determination of the current density of each immersion liquid to estimate the solubility of each thermally sprayed film and the subsequent investigation of the results thus obtained. The results thus obtained are plotted on FIG. 1. In FIG. 1, the heat-treatment temperature (° C.) is plotted as abscissa and the reaction current density (mA/cm$^2$) as ordinate.

The data plotted on FIG. 1 clearly indicate that, when using Al raw materials each having a purity of 4N or 5N, the resulting Al films have solubilities in water higher than that observed for the Al film produced using 3NAl and the data also indicate that there is observed, for the Al raw material having each specific purity, the following tendency: The higher the In concentration (not less than 2% by mass) in the Al composite material, the higher the solubility of the resulting Al film. For this reason, when an Al raw material having a purity of not less than 4N is used and an Al—In system has an In concentration of not less than 2% by mass, the resulting thermally sprayed Al film shows an excellent solubility in water. However, when using 5NAl as an Al raw material, problems arise such that the resulting thermally sprayed film has an extremely high activity and the solubility thereof is good but it may be handled with great difficulty.

Example 2

The inventors of this invention herein investigated the interrelation between the kind of the spraying gas used in the electric arc spraying process and the solubility or activity, in water, of the resulting thermally sprayed film which was prepared using Al—In composite materials each having the following composition and produced using 3NAl and 4NAl as Al raw materials and the results thus obtained were compared with each other. In this connection, the added amount of In is expressed in terms of that calculated on the basis of the mass of the Al raw material.

3NAl—3% by mass of In (spraying gas: Ar);
3NAl—3% by mass of In (spraying gas: Air);
4NAl—3% by mass of In (spraying gas: Ar);
4NAl—3% by mass of In (spraying gas: N2);
4NAl—3% by mass of In (spraying gas: Air).

Figure 2:
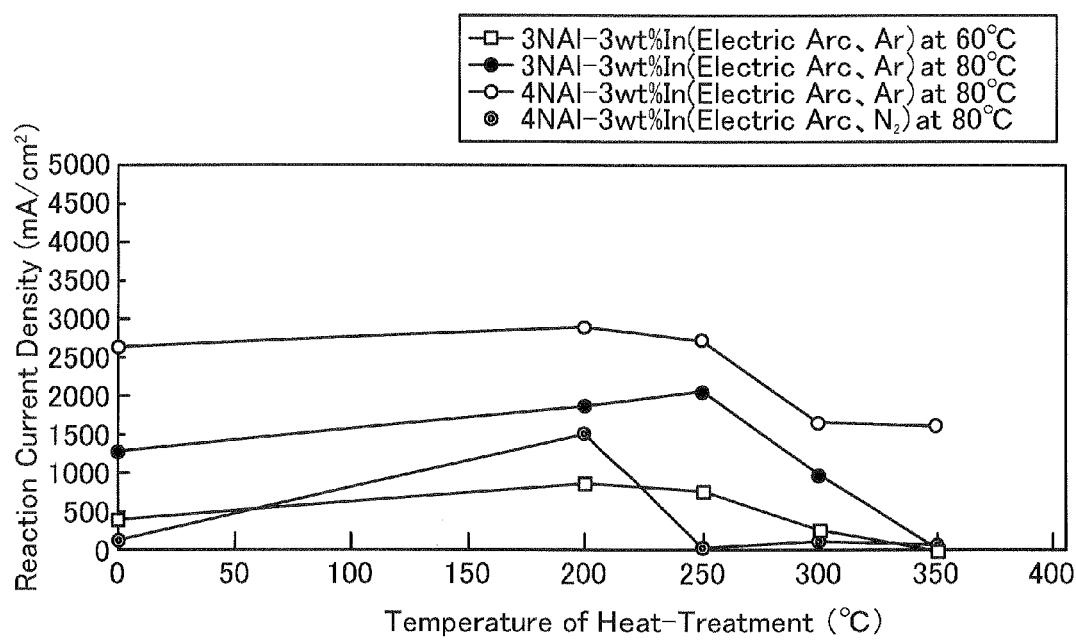
FIG. 2 is a graph showing the relation between the heat-treatment temperature (° C.) and the reaction current density (mA/cm$^2$), which is observed for the Al film prepared in Example 2.

There was combined Al with In at each corresponding rate specified above to make In uniformly disperse or dissolve in Al, the resulting blend was formed into a rod-like article for use as a thermal spraying material, and then the thermal spraying material was molten and thermally sprayed on the surface of a base material made of aluminum according to the rod electric arc spraying technique (heat source: electric energy; temperature: about 6,000° C.), while using various kinds of spraying gases specified above (spraying gas pressure: about 50 psi) to thus give various thermally sprayed films. Each of the thermally sprayed films thus produced was subjected to a heat-treatment at a temperature ranging from 0 to 350° C. (the film was treated in the atmosphere for one hour and subsequently cooled within a furnace) in place of subjecting the same to the influence of thermal hysteresis possibly encountered during the film-forming process. Thereafter, the base material provided thereon with the thermally sprayed film prior to the heat-treatment (0° C.) and the same base material used above and obtained after the heat-treatment each were immersed in 300 mL of pure water maintained at 60° C. or 80° C., followed by the determination of the current density of each immersion liquid to evaluate the solubility of each thermally sprayed film and the subsequent investigation of the results thus obtained. The results thus obtained are plotted on FIG. 2. In FIG. 2, the heat-treatment temperature (C) is plotted as abscissa and the reaction current density (mA/cm$^2$) is plotted as ordinate. In this respect, however, when using the air as the spraying gas, the resulting Al film did not dissolve in water at all. Accordingly, the results obtained for the film are not plotted on FIG. 2.

As will be clear from the data plotted on FIG. 2, the Al film prepared using 4NAl shows high solubility in water as compared with the film prepared using 3NAl and the Al film prepared using Ar as the spraying gas shows extremely high solubility in water as compared with the film prepared using N2 as the spraying gas. Moreover, when using 4NAl as the Al raw material and Ar as the spraying gas, the resulting thermally sprayed Al film still shows a high solubility in water even after the film is subjected to a heat-treatment at a temperature of 350° C.

It was found that when immersing, in warm water maintained at 80° C., the base material covered with a thermally sprayed film (4NAl-3% by mass of In; spraying gas: Ar) having a good solubility in water and obtained after the foregoing heat-treatment, the reaction of the film with water is initiated immediately after the immersion, which is accompanied by the vigorous generation of hydrogen gas, the water is blackened as the reaction further proceeds because of the presence of, for instance, deposited In, finally the thermally sprayed film cannot maintain the state such that it is firmly adhered to the base material due to the reaction with water, and the film begins to be peeled off from the base material with dissolution. In the case of immersing, in warm water maintained at 60° C., the base material covered with the thermally sprayed Al film as mentioned above, the solubility of the film in water was not really good.

Example 3

Figure 3:
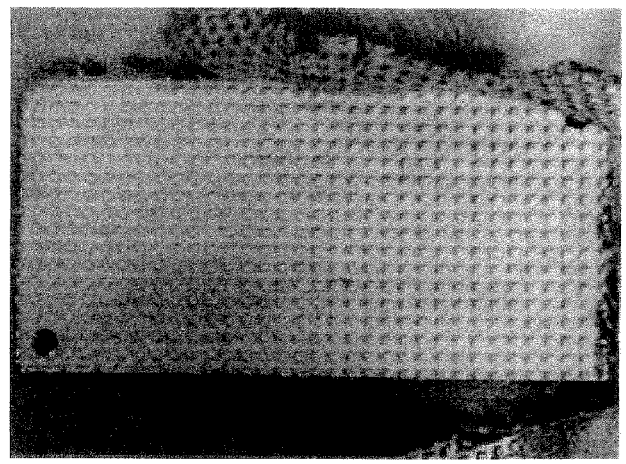
FIG. 3 is a photograph showing the adhered film (deposited film) peeled off from the base material provided thereon with the thermally sprayed Al film prepared in Example 3.

Platinum (Pt) film-forming operations were repeated over cycles using a sputtering apparatus provided with an adhesion-preventive plate whose surface had been covered with a thermally sprayed film (film thickness: 200 μm) of the 4NAl—3% by mass of In prepared in Example 2 (spraying gas: Ar) and then the adhesion-preventive plate to which the Pt film had been adhered was disassembled from the sputtering apparatus and treated with warm water maintained at 80° C. As a result, it was found that the thermally sprayed film is completely dissolved within 30 minutes and that the adhered film of Pt is peeled off from the adhesion-preventive plate, as shown in FIG. 3. Thus, Pt as the film-forming material could easily be recovered. At this stage, it was found that In and AlOOH is precipitated in the warm water.

Example 4

An example will be given in this Example, in which Si is added for the control of the activity (solubility) of the resulting thermally sprayed Al film.

Al—In—Si Compositions were prepared using 4NAl as the Al raw material and incorporating In and Si (including the contaminant Si present in the Al raw material) into the Al raw material, the resulting compositions were used for preparing thermally sprayed Al films and the latter was inspected for the relation between the purity of the Al raw material used in the composition, the added amount of Si and the solubility, in water, of the resulting thermally sprayed film. In this connection, the added amounts of In and Si are expressed in terms of those calculated on the basis of the mass of the Al raw material.

4NAl (contaminant Si: 100 ppm)—3% by mass of In;
4NAl—3% by mass of In—0.05% by mass of Si (including the contaminant Si of 90 ppm);
4NAl—3% by mass of In—0.1% by mass of Si (including the contaminant Si of 100 ppm);
4NAl—3% by mass of In—0.2% by mass of Si (including the contaminant Si of 100 ppm);
4NAl—2.6% by mass of In—0.5% by mass of Si (including the contaminant Si of 100 ppm).

Figure 4:
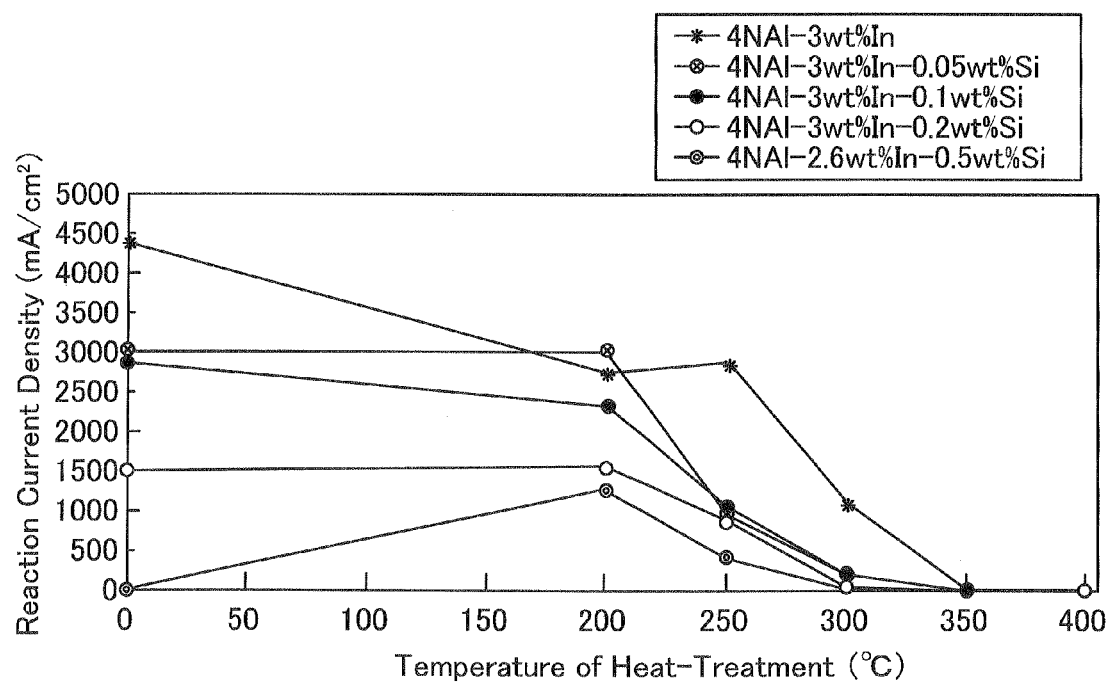
FIG. 4 is a graph showing the relation between the heat-treatment temperature (° C.) and the reaction current density (mA/cm$^2$), which is observed for the thermally sprayed Al film prepared in Example 4.

There was combined Al with In and Si at each corresponding rate specified above to make In and Si uniformly disperse or dissolve in Al, the resulting blend was formed into a rod-like article for use as a thermal spraying material, and then the thermal spraying material was molten and thermally sprayed on the surface of a base material made of aluminum according to the rod electric arc spraying technique (heat source: electric energy; temperature: about 6,000° C.), while using Ar gas as a spraying gas (spraying gas pressure: about 50 psi) to thus give each corresponding thermally sprayed film. Each of the thermally sprayed films thus produced was subjected to a heat-treatment at a temperature ranging from 0 to 400° C. (the film was treated in the atmosphere for one hour and subsequently cooled within a furnace) in place of subjecting the same to the influence of thermal hysteresis possibly encountered during the film-forming process. Thereafter, the base material provided thereon with the thermally sprayed film prior to the heat-treatment (0° C.) and the same base material used above and obtained after the heat-treatment (after experiencing the thermal hysteresis) each were immersed in 300 mL, of pure water maintained at 80° C., followed by the determination of the current density of each immersion liquid to evaluate the solubility of each thermally sprayed film and the subsequent investigation of the results thus obtained. The results thus obtained are plotted on FIG. 4. In FIG. 4, the heat-treatment temperature (° C.) is plotted as abscissa and the reaction current density (mA/cm$^2$) as ordinate.

The data plotted on FIG. 4 clearly indicate that the addition of a predetermined amount of Si permits the control of the activity and, in other words, the solubility of the thermally sprayed film prior to the heat-treatment while the film is in the condition just after the formation thereof by the thermal spraying technique. Accordingly, the dissolution of the thermally sprayed film through the reaction thereof with the moisture present in the atmosphere can be prevented with certainty. Moreover, if the upper limit of the temperature of the thermal hysteresis within the film-forming chamber is on the order of about 300° C., it was found that a thermally sprayed Al film can be produced using an Al composite material having an added Si content ranging from 0.04 to 0.6% by mass and preferably 0.05 to 0.5% by mass and the resulting Al film would have a practically acceptable activity or solubility in water. On the other hand, if the upper limit of the temperature of the thermal hysteresis is high on the order of about 350° C., it was found that a thermally sprayed Al film having a practically acceptable activity or solubility can be produced using an Al composite material having an added Si content ranging from 0.04 to 0.2% by mass and preferably 0.05 to 0.1% by mass.

It was found that when immersing, in warm water maintained at 80° C., the base material covered with a thermally sprayed Al film (4NAl—3% by mass of In—0.1% by mass of Si) having a good solubility in water and obtained after the foregoing heat-treatment, the reaction of the film with water is initiated immediately after the immersion, which is accompanied by the vigorous generation of hydrogen gas, the water undergoes blackening as the reaction further proceeds because of the presence of, for instance, deposited In, finally the thermally sprayed film cannot maintain the state such that it is firmly adhered to the base material due to the reaction with water, and the film begins to be peeled off from the base material with dissolution.

Example 5

Al—In—Si Compositions were prepared using 4NAl and 5NAl as the Al raw materials and incorporating In and Si (including the contaminant Si present in the Al raw materials) into the Al raw material, the compositions were then used for the preparation of thermally sprayed Al films and the resulting Al films each were inspected for the relation between the purity of the Al raw material used in the composition, the added amount of Si and the solubility, in water, of the resulting thermally sprayed film. In this connection, the added amounts of In and Si are expressed in terms of those calculated on the basis of the mass of the Al raw material.

4NAl—2% by mass of In—0.05% by mass of Si (including 90 ppm of the contaminant Si);

4NAl—3% by mass of In—0.1% by mass of Si (including 100 ppm of the contaminant Si);

4NAl—4% by mass of In—0.5% by mass of Si (including 100 ppm of the contaminant Si);

5NAl—1.5% by mass of In—0.05% by mass of Si (including 100 ppm of the contaminant Si);

5NAl—2.6% by mass of In—0.1% by mass of Si (including 100 ppm of the contaminant Si);

5NAl—3.5% by mass of In—0.5% by mass of Si (including 100 ppm of the contaminant Si)

There were combined Al, In and Si with each other at the rates specified above and the same procedures used in Example 1 were repeated to thus form each corresponding thermally sprayed film (spraying gas used: Ar gas). Each of the thermally sprayed films thus produced was subjected to a heat-treatment according to the same procedures used in Example 1 (the film was treated in the atmosphere for one hour and it was subsequently cooled within a furnace). Thereafter, the base material provided thereon with the thermally sprayed film prior to the heat-treatment (0° C.) and the same base material used above and obtained after the heat-treatment (the base material which experienced thermal hysteresis) each were immersed in 300 mL of pure water maintained at 80° C., followed by the determination of the current density of each immersion liquid to estimate the solubility of each thermally sprayed film and the investigation of the results thus obtained.

As a result, there was observed the same tendency as that observed in Example 4. It was thus found that the addition of a predetermined amount of Si permits the control of the activity and, in other words, the solubility of the thermally sprayed film prior to the heat-treatment, while the film was in the condition just after the formation thereof by the thermal spraying technique. Moreover, if the upper limit of the temperature of the heat-treatment is on the order of about 300° C., it was found that a thermally sprayed Al film can be produced using an Al composite material having an added In content of not less than 2% by mass and an added Si content ranging from 0.04 to 0.6% by mass and that the resulting Al film would have a practically acceptable activity or solubility in water. On the other hand, if the upper limit of the temperature of the heat-treatment is high on the order of about 350° C., it was found that a thermally sprayed Al film having a practically acceptable activity or solubility would be able to be produced using an Al composite material having an added In content of not less than 2% by mass and an added Si content ranging from 0.04 to 0.2% by mass.

Example 6

The same film-forming process disclosed in Example 3 were repeated except for using a sputtering apparatus provided with an adhesion-preventive plate whose surface had been covered with a thermally sprayed film (film thickness: 200 μm) of the 4NAl—3% by mass of In—0.1% by mass of Si prepared in Example 4 and then the same deposit-peeling test used in Example 3 were likewise repeated except for using the foregoing adhesion-preventive plate. As a result, it was found that the thermally sprayed film is completely dissolved and that the adhered film of Pt is peeled off from the adhesion-preventive plate, as in the case of Example 3.

INDUSTRIAL APPLICABILITY

According to the present invention, the surface of constituent members for a film-forming chamber of a vacuum film-forming apparatus, which is used in forming a thin film of a metal or a metal compound according to the sputtering technique, the vacuum deposition technique, the ion-plating technique and the CVD technique, is covered with the water-reactive Al film. Accordingly, the film inevitably adhered, during the film-forming process, to the surface of such a constituent member for a film-forming chamber can be peeled off therefrom in a moisture-containing atmosphere and can easily be recovered. Therefore, the present invention can be used in the fields in which these film-forming apparatuses are employed, for instance, in the technical fields related to semiconductor elements and electronics-related machinery and tools for the purpose of increasing the number of reuse times of the constituent members for a film-forming chamber of a film-forming apparatus and of recovering the film-forming materials which contains valuable metals.

What is claimed is:

1. A method for the production of a water-reactive Al film comprising the steps of:

melting a material which comprises 4NAl or 5NAl as an Al raw material and added In in an amount ranging from 2 to 5% by mass on the basis of the mass of the Al raw material in such a manner that the composition of the material becomes uniform;

thermally spraying the resulting molten material on the surface of a base material according to the electric arc spraying technique; and solidifying the sprayed molten material through quenching to thus form the water-reactive Al film in which In is uniformly dispersed in Al crystalline grains, wherein even after the water-reactive Al film is subjected to an influence of a thermal hysteresis within a film forming chamber of a film forming apparatus in which an upper limit of a thermal hysteresis temperature is of an order of 300 to 350oC, reaction current density, as determined by immersing the base material covered with the water-reactive Al film in warm water maintained at a temperature ranging from 40 to 130oC, is not less than 50 mA/cm2.

2. A constituent member for a film-forming chamber of a film-forming apparatus characterized in that it is provided thereon with a water-reactive Al film prepared according to the method as set forth in claim 1.

3. The constituent member for a film-forming chamber as set forth in claim 2, wherein the constituent member is an adhesion-preventive plate, a shutter or a mask.

4. A method for the production of a water-reactive Al film comprising the steps of:

melting a material which comprises 4NAJ or 5NAl as an Al raw material, and added In in an amount ranging from 2 to 5% by mass and added Si, including the Si as an impurity of the Al raw material, in a total amount ranging from 0.04 to 0.6% by mass, on the basis of the mass of the Al raw material in such a manner that the resulting molten material has a uniform composition;

thermally spraying the spraying the resulting molten material on the surface of a base material according to the electric arc spraying technique; and solidifying the sprayed molten material through quenching to thus form the water-reactive Al film in which In is uniformly dispersed in Al crystalline grains, wherein even after the water-reactive Al film is subjected to an influence of a thermal hysteresis within a film forming chamber of a film forming apparatus in which an upper limit of a thermal hysteresis temperature is of an order of 300 to 350oC, reaction current density, as determined by immersing the base material covered with the water-reactive Al film in warm water maintained at a temperature ranging from 40 to 130oC, is not less than 50 mA/cm2.

5. A constituent member for a film-forming chamber of a film-forming apparatus characterized in that it is provided thereon with a water-reactive Al film prepared according to the method as set forth in claim 4.

6. The constituent member for a film-forming chamber as set forth in claim 5, wherein the constituent member is an adhesion-preventive plate; a shutter or a mask.

* * * * *